United States Patent
Jiang et al.

(10) Patent No.: US 11,784,487 B2
(45) Date of Patent: Oct. 10, 2023

(54) OVERVOLTAGE PROTECTING SYSTEM AND METHOD OF MOTOR PRE-DRIVER

(71) Applicant: ANPEC ELECTRONICS CORPORATION, Hsinchu (TW)

(72) Inventors: Jyun-Ping Jiang, Hsinchu (TW); Shih-Hai Chien, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 324 days.

(21) Appl. No.: 17/324,109

(22) Filed: May 19, 2021

(65) Prior Publication Data

US 2022/0255311 A1    Aug. 11, 2022

(30) Foreign Application Priority Data

Feb. 8, 2021   (TW) ................................ 110104702

(51) Int. Cl.
*H02H 7/08* (2006.01)
*H03K 5/24* (2006.01)
*H02H 1/00* (2006.01)

(52) U.S. Cl.
CPC ........ *H02H 7/0833* (2013.01); *H02H 1/0007* (2013.01); *H03K 5/24* (2013.01)

(58) Field of Classification Search
CPC ....... H02H 7/0833; H02H 1/0007; H03K 5/24
USPC .......................................................... 361/33
See application file for complete search history.

(56) References Cited

U.S. PATENT DOCUMENTS

| 11,101,647 B1* | 8/2021 | Chen | H02H 9/041 |
| 11,522,485 B2* | 12/2022 | Chen | H02P 27/08 |
| 11,664,655 B2* | 5/2023 | Jiang | H02P 7/04 |
| | | | 361/18 |
| 2006/0023388 A1* | 2/2006 | Ichikawa | F16F 15/02 |
| | | | 361/139 |
| 2009/0135531 A1* | 5/2009 | Hirata | H02P 7/29 |
| | | | 361/18 |
| 2022/0255314 A1* | 8/2022 | Jiang | H02P 7/04 |

FOREIGN PATENT DOCUMENTS

CN       101313460 B  *  1/2012  ............... H02P 1/22

* cited by examiner

*Primary Examiner* — Kawing Chan
(74) *Attorney, Agent, or Firm* — Li & Cai Intellectual Property Office

(57) ABSTRACT

An overvoltage protecting system and method of a motor pre-driver are provided. An overvoltage protecting circuit compares a first reference voltage with a common voltage inputted to a single phase motor to output a first comparison signal. When a controller circuit determines that the common voltage is higher than the first reference voltage according to the first comparison signal, the controller circuit turns off a first high-side switch and a second high-side switch, and turns on the first low-side switch and the second low-side switch, during a phase time of a phase transition signal of the single phase motor. After the phase time ends, the controller circuit alternately turns on the first low-side switch and the second low-side switch according to a level of the phase transition signal.

11 Claims, 9 Drawing Sheets

OVERVOLTAGE PROTECTING SYSTEM AND METHOD OF MOTOR PRE-DRIVER

CROSS-REFERENCE TO RELATED PATENT APPLICATION

This application claims the benefit of priority to Taiwan Patent Application No. 110104702, filed on Feb. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an overvoltage protecting system, and more particularly to an overvoltage protecting system and method of a motor pre-driver for protecting a bridge driver circuit of a single phase motor.

BACKGROUND OF THE DISCLOSURE

Circuit components of electronic products produce heat during operation, by which air circulated throughout an enclosed space, especially in an enclosed chassis of a server, is heated up. As a result, other circuit components are damaged due to overheating. Therefore, fans must be disposed in the electronic products and used to cool down the circuit components of the electronic products.

However, when a controller circuit controls transistors of a motor driver circuit to drive a single phase motor of the fan to rotate such that blades of the fan rotate, a reverse current recharges a common voltage coupled to the single phase motor to exceed a voltage that the transistors of the motor driver circuit can withstand. Therefore, the transistors of the motor driver circuit are damaged.

SUMMARY OF THE DISCLOSURE

In response to the above-referenced technical inadequacies, the present disclosure provides an overvoltage protecting system of a motor pre-driver, which is applicable to a bridge driver circuit of a single phase motor. The bridge driver circuit includes a plurality of switch components. The switch components include a first high-side switch, a first low-side switch, a second high-side switch and a second low-side switch. A first terminal of the first high-side switch and a first terminal of the second high-side switch are coupled to a common voltage. A first node between a second terminal of the first high-side switch and a first terminal of the first low-side switch is connected to a first terminal of the single phase motor. A second node between a second terminal of the second high-side switch and a first terminal of the second low-side switch is connected to a second terminal of the single phase motor. A second terminal of the first low-side switch and a second terminal of the second low-side switch are grounded. The overvoltage protecting system of the motor pre-driver includes an overvoltage protecting circuit and a controller circuit. The overvoltage protecting circuit is disposed in the motor pre-driver and coupled to the common voltage. The overvoltage protecting circuit is configured to compare the common voltage and a first reference voltage to output a first comparison signal. The controller circuit is disposed in the motor pre-driver. The controller circuit is connected to a control terminal of each of the switch components and the overvoltage protecting circuit. The controller circuit is configured to output a plurality of controlling signals respectively to the switch components to turn on or off each of the switch components. When the controller circuit determines that the common voltage is higher than the first reference voltage according to the first comparison signal, the controller circuit turns off the first high-side switch and the second high-side switch, and turns on the first low-side switch and the second low-side switch, during a phase time of a commutation signal. After the phase time ends, the controller circuit alternately turns on the first low-side switch and the second low-side switch according to a level of the commutation signal.

In the embodiment, when a present time reaches a commutation time point at which the commutation signal is traversing from a first level to a second level, the controller circuit turns off the first low-side switch and turns on the second low-side switch. When the present time reaches a commutation time point at which the commutation signal is traversing from the second level to the first level, the controller circuit turns off the second low-side switch and turns on the first low-side switch.

In the embodiment, the overvoltage protecting circuit includes a first comparator. A first input terminal of the first comparator is coupled to the common voltage. A second input terminal of the first comparator is coupled to the first reference voltage. The first comparator is configured to compare the common voltage with the first reference voltage to output the first comparison signal.

In the embodiment, the overvoltage protecting circuit compares the common voltage with a second reference voltage to output a second comparison signal. When the controller circuit determines that the common voltage is higher than the second reference voltage and not higher than the first reference voltage according to the second comparison signal, the controller circuit slightly switches the first high-side switch to an on state from an off state, still fully turns on the first low-side switch and the second high-side switch, and continually turns off the second low-side switch.

In the embodiment, the overvoltage protecting circuit further includes a second comparator. A first input terminal of the second comparator is coupled to the common voltage. A second input terminal of the second comparator is coupled to the second reference voltage. The second comparator is configured to compare the common voltage with the second reference voltage to output the second comparison signal.

In the embodiment, the overvoltage protecting circuit compares the common voltage with a second reference voltage to output a second comparison signal. When the controller circuit determines that the common voltage is higher than the second reference voltage and not higher than the first reference voltage according to the second comparison signal, the controller circuit slightly switches the second high-side switch to an on state from an off state, still fully turns on the first high-side switch and the second low-side switch, and continually turns off the first low-side switch.

In the embodiment, the overvoltage protecting circuit further includes a second comparator. A first input terminal of the second comparator is coupled to the common voltage. A second input terminal of the second comparator is coupled to the second reference voltage. The second comparator is configured to compare the common voltage with the second reference voltage to output the second comparison signal.

In addition, the present disclosure provides an overvoltage protecting method of the motor pre-driver, which is applicable to a bridge driver circuit of a single phase motor. The bridge driver circuit includes a plurality of switch components. The switch components include a first high-side switch, a first low-side switch, a second high-side switch and a second low-side switch. A first terminal of the first high-side switch and a first terminal of the second high-side switch are coupled to a common voltage. A first node between a second terminal of the first high-side switch and a first terminal of the first low-side switch is connected to a first terminal of the single phase motor. A second node between a second terminal of the second high-side switch and a first terminal of the second low-side switch is connected to a second terminal of the single phase motor. A second terminal of the first low-side switch and a second terminal of the second low-side switch are grounded. The overvoltage protecting method of the motor pre-driver includes the following steps: comparing the common voltage with a first reference voltage to generate a first comparison signal; determining whether or not the common voltage reaches the first reference voltage according to the first comparison signal, in response to determining that the common voltage does not reach the first reference voltage, returning to the previous step, in response to determining that the common voltage reaches the first reference voltage, performing the next step; turning off the first high-side switch and the second high-side switch, and turning on the first low-side switch and the second low-side switch, during a phase time of a commutation signal; and after the phase time ends, alternately turning on the first low-side switch and the second low-side switch according to a level of the commutation signal.

In the embodiment, the overvoltage protecting method further includes the following steps: determining whether or not a present time reaches a commutation time point at which the commutation signal is traversing from a first level to a second level, in response to determining that the present time reaches the commutation time point at which the commutation signal is traversing from the first level to the second level, turning off the first low-side switch and turning on the second low-side switch, but not performing the next step, but in response to determining that the present time does not reach the commutation time point at which the commutation signal is traversing from the first level to the second level, performing the next step; and determining whether or not the present time reaches a commutation time point at which the commutation signal is traversing from the second level to the first level, in response to determining that the present time reaches the commutation time point at which the commutation signal is traversing from the second level to the first level, turning off the second low-side switch and turning on the first low-side switch, but in response to determining that the present time does not reach the commutation time point at which the commutation signal is traversing from the second level to the first level, returning to the previous step.

In the embodiment, the overvoltage protecting method further includes the following steps: comparing the common voltage with a second reference voltage to generate a second comparison signal; and determining, according to the second comparison signal, whether or not the common voltage is higher than the second reference voltage and not higher than the first reference voltage, in response to determining that the common voltage is not higher than the second reference voltage or higher than the first reference voltage, returning to the previous step, but in response to determining that the common voltage is higher than the second reference voltage and not higher than the first reference voltage, slightly switching the first high-side switch to an on state from an off state, still fully turning on the first low-side switch and the second high-side switch, and continually turns off the second low-side switch.

In the embodiment, the overvoltage protecting method further includes the following steps: comparing the common voltage with a second reference voltage to generate a second comparison signal; and determining, according to the second comparison signal, whether or not the common voltage is higher than the second reference voltage and not higher than the first reference voltage, in response to determining that the common voltage is not higher than the second reference voltage or higher than the first reference voltage, returning to the previous step, but in response to determining that the common voltage is higher than the second reference voltage and not higher than the first reference voltage, slightly switching the second high-side switch to an on state from an off state, still fully turning on the first high-side switch and the second low-side switch, and continually turns off the first low-side switch.

As described above, the present disclosure provides the overvoltage protecting system and method of the motor pre-driver, which have the following main characteristics:

1. the common voltage of the single phase motor is detected, and when the controller circuit determines that the common voltage is higher than the first reference voltage, the controller circuit fully turns off the first and second high-side switches, and fully turns on the first and second low-side switches, in the first stage, thereby preventing the common voltage from being charged by the reverse current;
2. when the present time reaches the commutation time point of the commutation signal, the motor pre-driver fully turns off the first and second high-side switches, and alternately turns on the first and second low-side switches according to the level of the commutation signal, in the second stage, such that a temperature of the bridge driver circuit is reduced; and
3. when the common voltage continually increases, the first and second high-side switches are continually turned off, thereby preventing the first and second high-side switches from being damaged due to overheating.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
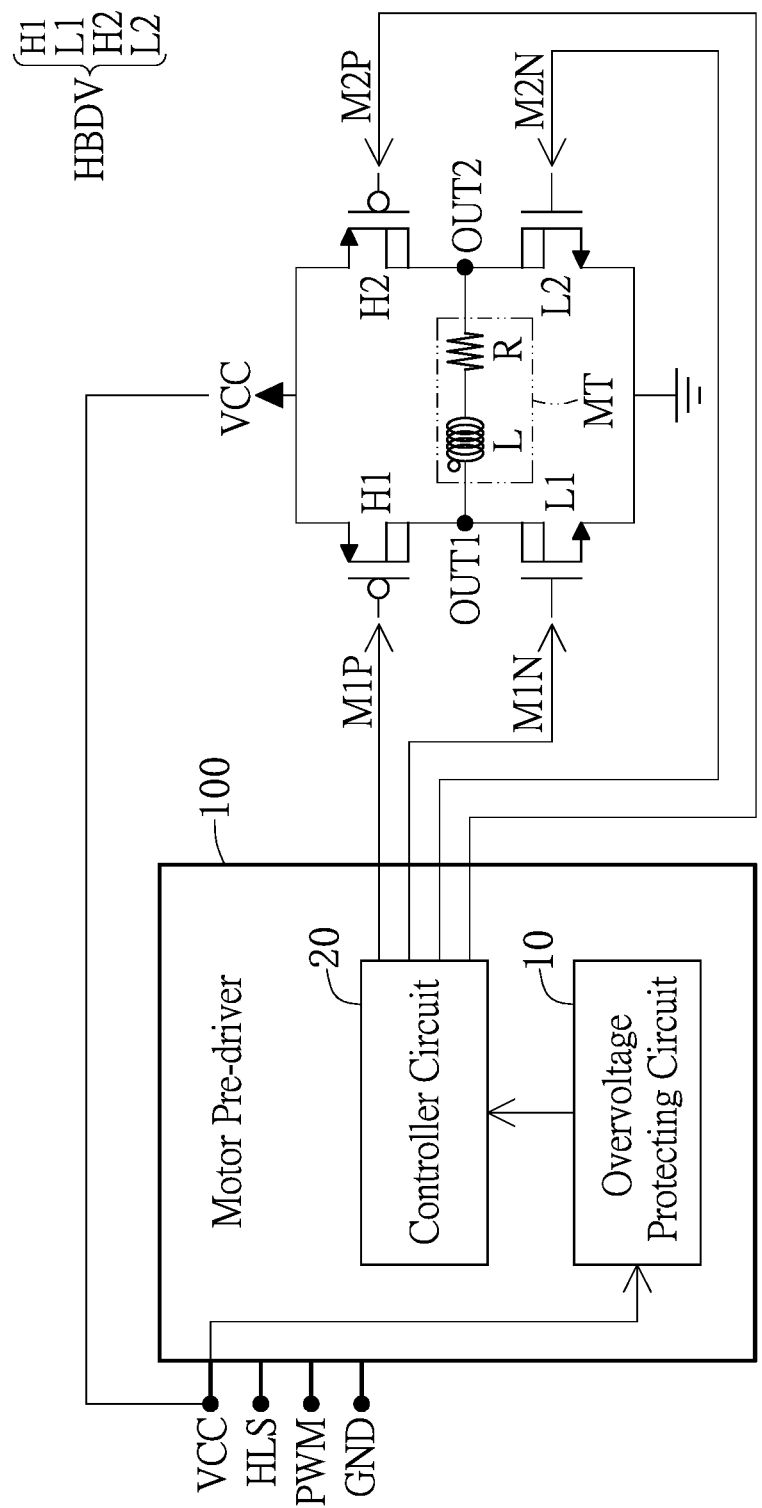
FIG. 1 is a schematic diagram of an overvoltage protecting system of a motor pre-driver, a single phase motor and a bridge driver circuit according to first to third embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
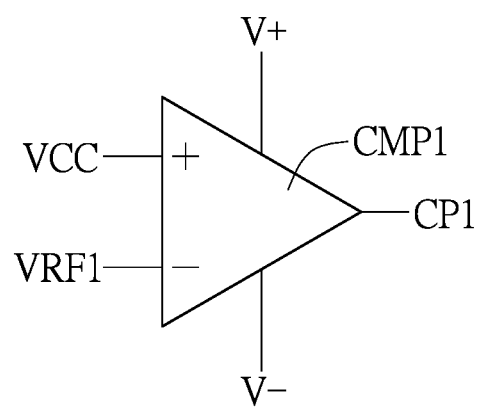
FIG. 2 is a schematic diagram of circuit components of an overvoltage protecting circuit of the overvoltage protecting system of the motor pre-driver according to the first embodiment of the present disclosure.
Figure 3:
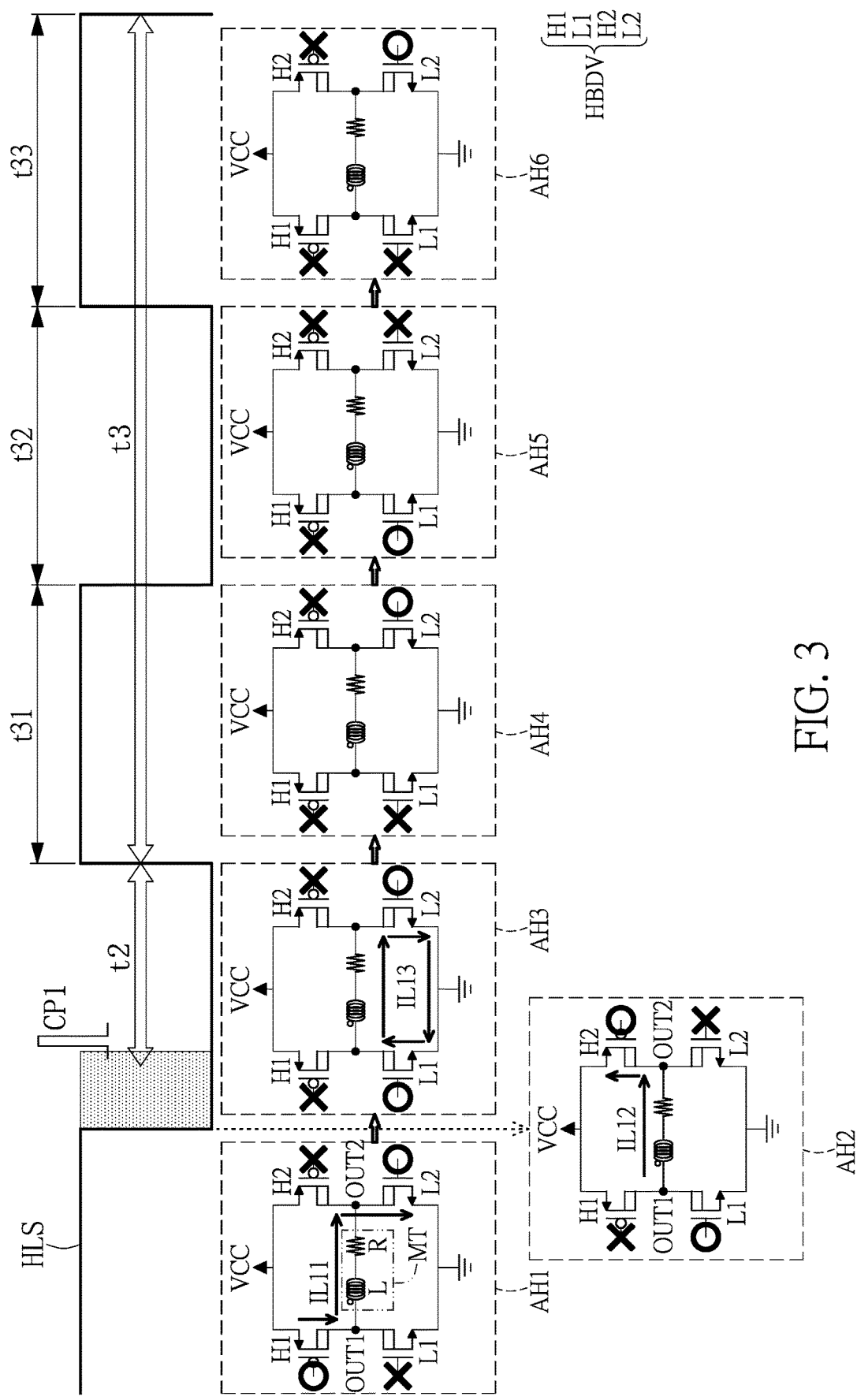
FIG. 3 is a schematic diagram of the bridge driver circuit that is switched by using the overvoltage protecting system and an overvoltage protecting method of the motor pre-driver according to the first embodiment of the present disclosure.
Figure 4:
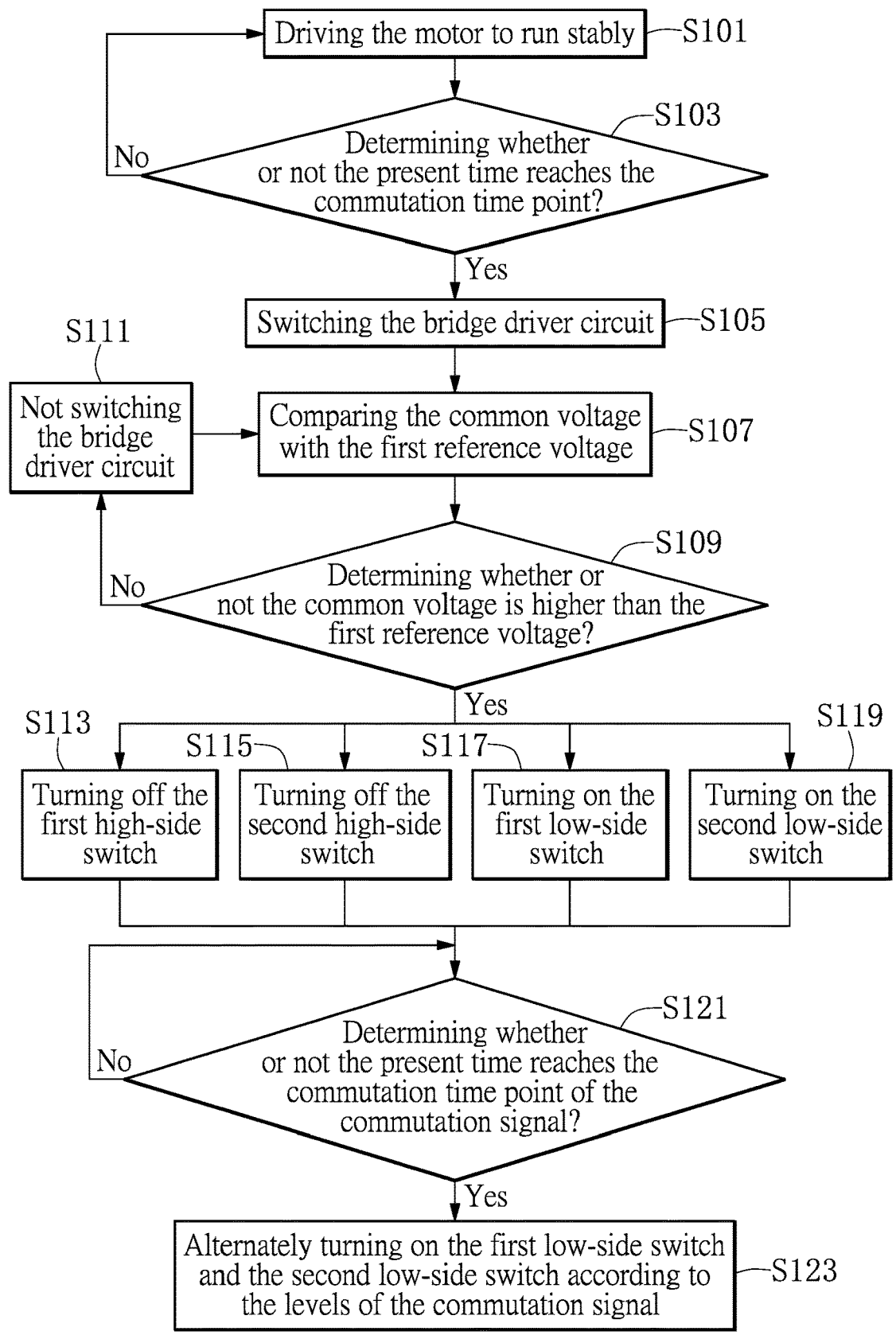
FIG. 4 is a flowchart diagram of the overvoltage protecting method of the motor pre-driver according to the first embodiment of the present disclosure.

Reference is made to FIGS. 1 to 4. FIG. 1 is a schematic diagram of an overvoltage protecting system of a motor pre-driver, a single phase motor and a bridge driver circuit according to first to third embodiments of the present disclosure. FIG. 2 is a schematic diagram of circuit components of an overvoltage protecting circuit of the overvoltage protecting system of the motor pre-driver according to the first embodiment of the present disclosure. FIG. 3 is a schematic diagram of the bridge driver circuit that is switched by using the overvoltage protecting system and an overvoltage protecting method of the motor pre-driver according to the first embodiment of the present disclosure. FIG. 4 is a flowchart diagram of the overvoltage protecting method of the motor pre-driver according to the first embodiment of the present disclosure.

In the embodiment, the overvoltage protecting method may include steps S101 to S123 shown in FIG. 4 that may be sequentially performed on a bridge driver circuit HBDV of a single phase motor MT by a motor pre-driver 100 as shown in FIG. 1.

As shown in FIG. 1, the motor pre-driver 100 may include an overvoltage protecting circuit 10 and a controller circuit 20 that are disposed in the motor pre-driver 100. The controller circuit 20 is connected to the overvoltage protecting circuit 10 and the bridge driver circuit HBDV. The overvoltage protecting circuit 10 is coupled to a common voltage VCC. The single phase motor MT is connected to the bridge driver circuit HBDV and coupled to the common voltage VCC.

The bridge driver circuit HBDV includes the same type or different types of switch components such as a first high-side switch H1, a first low-side switch L1, a second high-side switch H2 and a second low-side switch L2 that form an H-bridge driver circuit, but the present disclosure is not limited thereto.

A first terminal of the first high-side switch H1 and a first terminal of the second high-side switch H2 are coupled to the common voltage VCC. A first node OUT1 between a second terminal of the first high-side switch H1 and a first terminal of the first low-side switch L1 is connected to a first terminal of the single phase motor MT that is a first terminal of an inductor L of the single phase motor MT. A second terminal of the inductor L is connected to a first terminal of a resistor R of the single phase motor MT. A second node OUT2 between a second terminal of the second high-side switch H2 and a first terminal of the second low-side switch L2 is connected to a second terminal of the single phase motor MT that is a second terminal of the resistor R of the single phase motor MT. A second terminal of the first low-side switch L1 and a second terminal of the second low-side switch L2 are grounded.

The bridge driver circuit HBDV is disposed outside the motor pre-driver 100. Therefore, heat cannot be dissipated away from the bridge driver circuit HBDV through a heat dissipating component inside the motor pre-driver 100. If capacitors having large capacitance values are disposed on a circuit board of the bridge driver circuit HBDV, the switch components of the bridge driver circuit HBDV are prevented from being damaged. However, when a fan only has a small volume, and the single phase motor MT and the bridge driver circuit HBDV have been disposed into the fan, the capacitor cannot be further accommodated into the fan. Under this condition, steps S101 to S123 shown in FIG. 4 need to be performed, thereby preventing the bridge driver circuit HBDV from being damaged due to overheating, which is specifically described in the following.

In step S101, the controller circuit 20 outputs a plurality of controlling signals M1P, M1N, M2P, M2N respectively to control terminals of the switch components of the bridge driver circuit HBDV to turn on or off the switch components to drive the single phase motor MT to stably run in a normal mode.

For example, the bridge driver circuit HBDV is switched as shown in a dotted line AH1 in FIG. 3. In detail, the controller circuit 20 outputs the controlling signal M1N at a low level to the first low-side switch L1 to turn off the first low-side switch L1. The controller circuit 20 outputs the controlling signal M2P at a high level to the second high-side switch H2 to turn off the second high-side switch H2. The controller circuit 20 outputs the controlling signal M1P at a low level to the first high-side switch H1 to turn on the first high-side switch H1. The controller circuit 20 outputs the controlling signal M2N at a high level to the second low-side switch L2 to turn on the second low-side switch L2. At this time, the bridge driver circuit HBDV drives the single phase motor MT to stably run, and a forward current IL11 flows to ground sequentially through the single phase motor MT and the second low-side switch L2 from the first high-side switch H1.

In the embodiment, when a commutation signal HLS reaches a high level, the forward current IL11 flows from the first node OUT1 of the single phase motor MT to the second node OUT2 of the single phase motor MT, but the present disclosure is not limited thereto. The commutation signal HLS represents that rotation of rotors or blades of the fan is detected, and a low level and a high level of the commutation signal HLS represent polarity directions. The bridge driver circuit HBDV may be switched at different preset levels of the commutation signal HLS to control a flow direction of a current according to actual requirements. For example, when the bridge driver circuit HBDV is at a low level, the current flows from the first node OUT1 to the second node OUT2.

In step S103, the controller circuit 20 determines whether or not a present time reaches a commutation time point of the commutation signal HLS. If the present time does not reach the commutation time point of the commutation signal HLS, step S101 is performed continuously. Conversely, if the present time reaches the commutation time point of the commutation signal HLS such as, but not limited to a time point of a falling edge (or a positive edge in practice) of one of waveforms of the commutation signal HLS as shown in FIG. 3, step S105 is then performed.

In step S105, the controller circuit 20 switches some of the switch components of the bridge driver circuit HBDV from an on state to an off state and switches others of the switch components from an off state to an on state.

For example, as shown in a dotted line AH2 in FIG. 3, the controller circuit 20 turns off the first high-side switch H1 and the second low-side switch L2, and turns on the first low-side switch L1 and the second high-side switch H2. As a result, a reverse current IL12 flows from the first low-side switch L1 through the single phase motor MT to the second high-side switch H2, and then flows to the common voltage VCC. The common voltage VCC is charged by the reverse current IL12 such that the common voltage VCC increases.

In the embodiment, the bridge driver circuit HBDV is switched from a state as shown in the dotted line AH1 in FIG. 3 to a state as shown in the dotted line AH2 in FIG. 3 during a commutation operation, but the present disclosure is not limited thereto. In practice, the bridge driver circuit HBDV may be switched from the state as shown in the dotted line AH2 in FIG. 3 to the state as shown in the dotted line AH1 in FIG. 3 during the commutation operation. Each time when the bridge driver circuit HBDV is switched, especially when the first high-side switch H1 or the second high-side switch H2 is turned on, the common voltage VCC is charged by a reverse current.

In step S107, when the common voltage VCC is being charged by the reverse current IL12, the overvoltage protecting circuit 10 obtains the common voltage VCC, and compares the common voltage VCC with a first reference voltage VREF1 to output a first comparison signal CP1 to the controller circuit 20.

For example, the overvoltage protecting circuit 10 includes a first comparator CMP1 shown in FIG. 2. A first input terminal such as a non-inverting terminal of the first comparator CMP1 is coupled to the common voltage VCC. A second input terminal such as an inverting terminal of the first comparator CMP1 is coupled to the first reference voltage VRF1. The first comparator CMP1 is configured to compare the common voltage VCC with the first reference voltage VRF1 to output the first comparison signal CP1 to the controller circuit 20.

In step S109, the controller circuit 20 determines whether or not the common voltage VCC is higher than the first reference voltage VRF1. If the first comparator CMP1 outputs the first comparison signal CP1 at a low level, the controller circuit 20 determines that the common voltage VCC is not higher than the first reference voltage VRF1 according to the first comparison signal CP1 at the low level, and then step S111 is performed.

In step S111, as shown in the dotted line AH2 in FIG. 3, the controller circuit 20 continually turns off the first high-side switch H1 and the second low-side switch L2, and turns on the first low-side switch L1 and the second high-side switch H2, to control the bridge driver circuit HBDV to drive the single phase motor MT to run stably. That is, the bridge driver circuit HBDV is not switched.

Conversely, if the first comparator CMP1 outputs the first comparison signal CP1 at a high level, the controller circuit 20 determines that the common voltage VCC is higher than the first reference voltage VREF1 according to the first comparison signal CP1 at the high level in step S109, and then steps S113 to S119 are performed.

In step S113, as shown in a dotted line AH3 in FIG. 3, the controller circuit 20 outputs the controlling signal M1P to the first high-side switch H1 to turn off the first high-side switch H1.

In step S115, as shown in the dotted line AH3 in FIG. 3, the controller circuit 20 outputs the controlling signal M1P to the second high-side switch H2 to turn off the second high-side switch H2.

In step S117, as shown in the dotted line AH3 in FIG. 3, the controller circuit 20 outputs the controlling signal M1N to the first low-side switch L1 to turn on the first low-side switch L1.

In step S119, as shown in the dotted line AH3 in FIG. 3, the controller circuit 20 outputs the controlling signal M2N to the second low-side switch L2 to turn on the second low-side switch L2.

After the first high-side switch H1 and the second high-side switch H2 are turned off in steps S113 to S119, the blades of the fan rotate inertially with the single phase motor MT at a rotation speed that is gradually decreasing. A closed path is formed between the first low-side switch L1 and the second low-side switch L2 that are being turned on. A current IL13 repeatedly flows through the first low-side switch L1 and the second low-side switch L2 in the closed path. The above-mentioned reverse current IL12 flowing to the common voltage VCC is not generated. Under this condition, the common voltage VCC cannot increase any more, thereby preventing the bridge driver circuit HBDV, especially the first high-side switch H1 and the second high-side switch H2, from being damaged by the common voltage VCC.

In step S121, after the controller circuit 20 turns off the first high-side switch H1 and the second high-side switch H2, and turns on the first low-side switch L1 and the second low-side switch L2 for a period of time, the controller circuit 20 determines whether or not the present time reaches a next commutation time point of the commutation signal HLS.

If the present time does not reach the next commutation time point of the commutation signal HLS, steps S113 to S119 are performed continually. Conversely, if the present time reaches the next commutation time point of the commutation signal HLS, the controller circuit 20 stops to turn on both of the first low-side switch L1 and the second low-side switch L2 at the same time in S113 to S119, and step S123 is then performed.

In step S123, the controller circuit 20 alternately turns on the first low-side switch L1 and the second low-side switch L2 according to the level of the commutation signal HLS.

For example, when the controller circuit 20 determines that the present time reaches a commutation time point at which the commutation signal HLS is traversing from a low level to a high level, the controller circuit 20 switches the bridge driver circuit HBDV as shown in a dotted line AH4 in FIG. 3. That is, the controller circuit 20 continually turns off the first high-side switch H1 and the second high-side switch H2, continually turns on the second low-side switch L2, but switches the first low-side switch L1 from an on state to an off state, during a working period t31 of a second one of the waveforms of the commutation signal HLS.

After the bridge driver circuit HBDV is switched as shown in the dotted line AH4 in FIG. 3 for a period of time, the present time reaches a next commutation time point of the commutation signal HLS, such as a commutation time point at which the commutation signal HLS is traversing from a high level to a low level. At this time, the controller circuit 20 switches the bridge driver circuit HBDV to a state as shown in a dotted line AH5 of FIG. 3 from the state as shown in the dotted line AH4 in FIG. 3. That is, the controller circuit 20 continually turns off the first high-side switch H1 and the second high-side switch H2, but switches the second low-side switch L2 from an on state to an off state, and switches the first low-side switch L1 from an off state to an on state, during a non-working period t32 of the second one of the waveforms of the commutation signal HLS.

In the embodiment, time points of a rising edge and a falling edge of each of the waveforms of the commutation signal HLS shown in FIG. 3 are defined as the commutation time points. Therefore, the controller circuit 20 alternately turns on the first low-side switch L1 and the second low-side switch L2 again and again.

In practice, after the bridge driver circuit HBDV is switched as shown in the dotted line AH3 in FIG. 3 for a period of time, the present time may reach the commutation time point of a falling edge (instead of a rising edge) of the commutation signal HLS. Under this condition, the bridge driver circuit HBDV is switched to the state as shown in the dotted line AH5 of FIG. 3 by the controller circuit 20. After a period of time has elapsed, the present time reaches a next commutation time point that is a rising edge of the commutation signal HLS, the bridge driver circuit HBDV is switched to the state as shown in the dotted line AH4 in FIG. 3 by the controller circuit 20.

Second Embodiment

Figure 5:
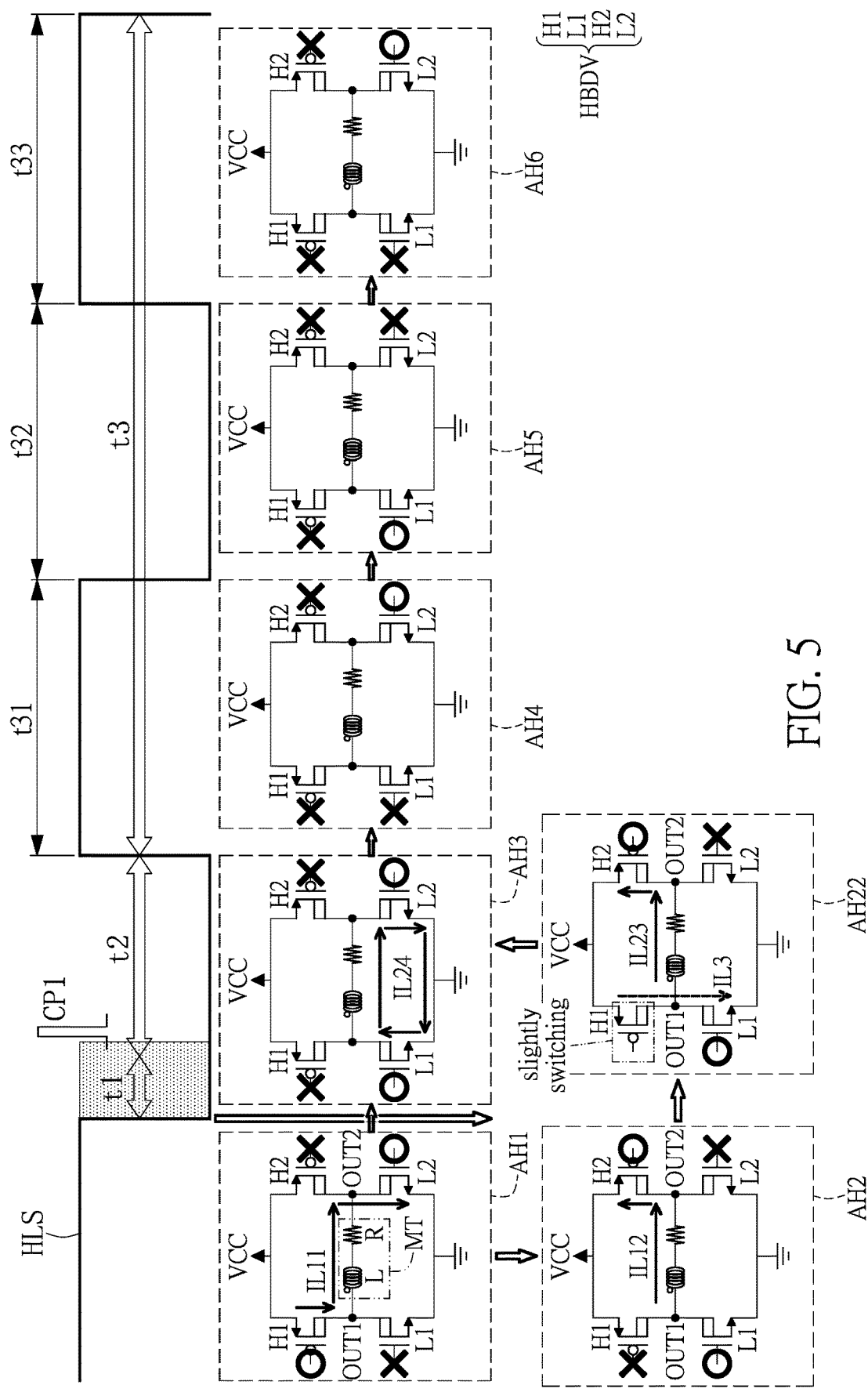
FIG. 5 is a schematic diagram of the bridge driver circuit that is switched by using the overvoltage protecting system and an overvoltage protecting method of the motor pre-driver according to the second embodiment of the present disclosure.
Figure 6:
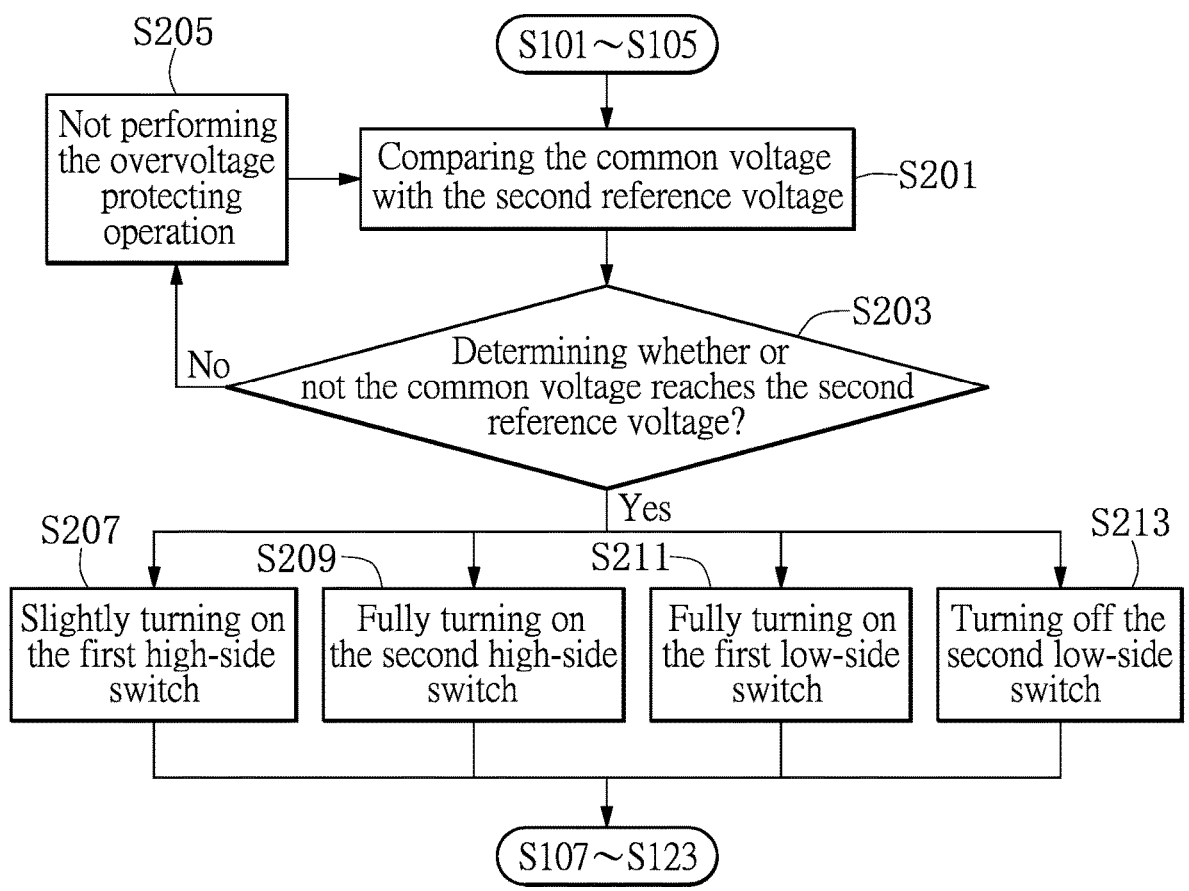
FIG. 6 is a flowchart diagram of the overvoltage protecting method of the motor pre-driver according to the second embodiment of the present disclosure.
Figure 8:
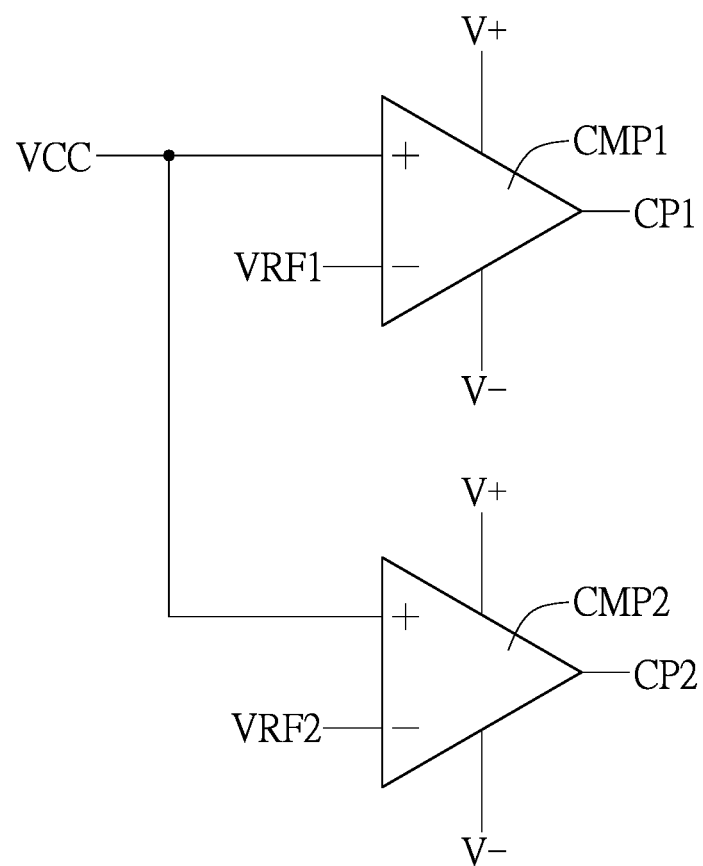
FIG. 8 is a schematic diagram of circuit components of an overvoltage protecting circuit of the overvoltage protecting system of the motor pre-driver according to the second and third embodiments of the present disclosure.

Reference is made to FIGS. 5, 6 and 8, in which FIG. 5 is a schematic diagram of the bridge driver circuit that is switched by using the overvoltage protecting system and an overvoltage protecting method of the motor pre-driver according to the second embodiment of the present disclosure, FIG. 6 is a flowchart diagram of the overvoltage protecting method of the motor pre-driver according to the second embodiment of the present disclosure, and FIG. 8 is a schematic diagram of circuit components of an overvoltage protecting circuit of the overvoltage protecting system of the motor pre-driver according to the second and third embodiments of the present disclosure.

In the embodiment, the overvoltage protecting method may further include steps S201 to S213 shown in FIG. 6 that may be performed by the motor pre-driver 100 of the overvoltage protecting system shown in FIG. 1.

For example, in the step S101, the controller circuit 20 fully turns on the first high-side switch H1, fully turns off the first low-side switch L1, fully turns off the second high-side switch H2 and fully turns on the second low-side switch L2 as shown in the dotted line AH1 in FIG. 5 to drive the single phase motor MT to run stably.

Therefore, when the controller circuit 20 determines that the present time reaches the commutation time point of the commutation signal HLS in step S103, the controller circuit 20 fully turns off the first high-side switch H1, fully turns on the first low-side switch L1, fully turns on the second high-side switch H2 and fully turns off the second low-side switch L2 as shown in the dotted line AH2 of FIG. 5 to drive the single phase motor MT to run stably in step S105.

It is worth noting that, after the controller circuit 20 switches the bridge driver circuit HBDV to the state as shown in the dotted line AH2 of FIG. 5 from the state as shown in the dotted line AH1 of FIG. 5, the reverse current IL12 flows through the second high-side switch H2 that is being fully switched and charges the common voltage VCC. When the common voltage VCC is being charged by the reverse current IL12, step S201 may be performed.

In step S201, when the common voltage VCC is being charged by the reverse current IL12, the common voltage VCC gradually increases, the overvoltage protecting circuit 10 continually detects the common voltage, VCC and then compares the detected common voltage VCC with a second reference voltage VREF2 to output a second comparison signal CP2.

For example, as shown in FIG. 8, the overvoltage protecting circuit 10 may not only includes the first comparator CMP1 as described above, but also include a second comparator CMP2. A first input terminal such as a non-inverting input terminal of the second comparator CMP2 is coupled to the common voltage VCC. A second input terminal such as an inverting input terminal of the second comparator CMP2 is coupled to the second reference voltage VREF2. The second comparator CMP2 is configured to compare the common voltage VCC with the second reference voltage VREF2 to output the second comparison signal CP2.

In step S203, the controller circuit 20 determines whether or not the common voltage VCC is higher than the second reference voltage VREF2 and is lower than the first reference voltage VREF1, according to the second comparison signal CP2.

If the common voltage VCC is not higher than the second reference voltage VREF2, the controller circuit 20 continually controls the bridge driver circuit HBDV as shown in the dotted line AH2 in FIG. 5 and does not switch the bridge driver circuit HBDV in step S205. Therefore, the overvoltage protecting circuit 10 continually detects and compares the common voltage VCC with the second reference voltage VREF2 in step S201.

When the common voltage VCC is charged to be higher than the second reference voltage VREF2 by the reverse current IL12, steps S207 to S213 are then performed.

In steps S207 to S213, as shown in a dotted line AH22 in FIG. 5, the controller circuit 20 slightly turns on the first high-side switch H1 that was fully turned off, but does not switch others of the switch components of the bridge driver circuit HBDV. That is, the controller circuit 20 still fully turns on the first low-side switch L1 and the second high-side switch H2, and turns off the second low-side switch L2. After steps S207 to S213 are performed, steps S107 to S123 are performed.

When the first high-side switch H1 is slightly turned on, a small amount of current IL3 slowly flows from the common voltage VCC sequentially through the first high-side switch H1 and the first low-side switch L1 to ground. As a result, the common voltage VCC is prevented from being charged to an excessive high voltage by the current, and the bridge driver circuit HBDV is prevented from being damaged by the common voltage VCC.

That is, when the common voltage VCC increases to be higher than the second reference voltage VREF2 and not higher than the first reference voltage VREF1, the first high-side switch H1 is slightly turned on as shown in the dotted line AH22 in FIG. 5.

Third Embodiment

Figure 7:
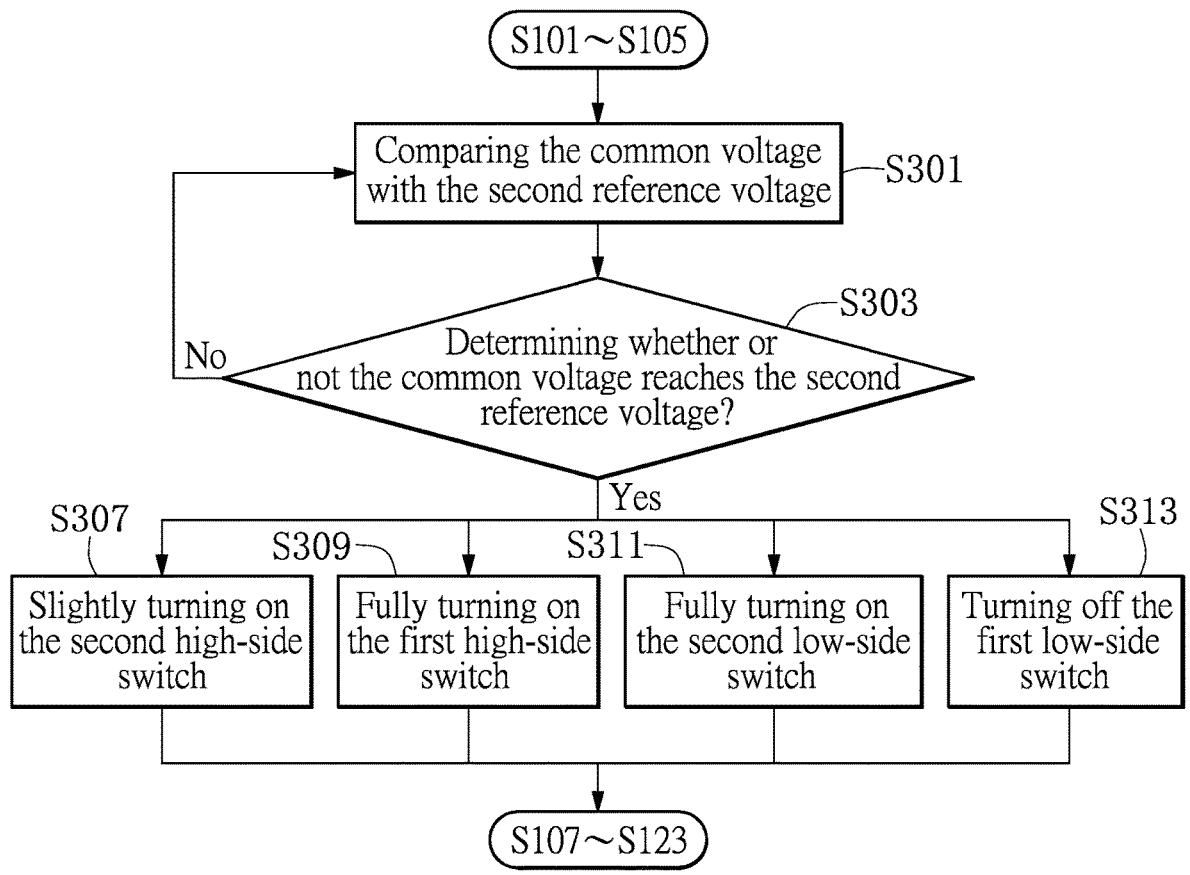
FIG. 7 is a flowchart diagram of an overvoltage protecting method of the motor pre-driver according to the third embodiment of the present disclosure.

Reference is made to FIGS. 7 and 8, in which FIG. 7 is a flowchart diagram of an overvoltage protecting method of the motor pre-driver according to the third embodiment of the present disclosure, and FIG. 8 is a schematic diagram of circuit components of an overvoltage protecting circuit of the overvoltage protecting system of the motor pre-driver according to the second and third embodiments of the present disclosure.

The overvoltage protecting method of the embodiment may further include steps S301 to S313 shown in FIG. 7 that may be performed by the motor pre-driver 100 of the overvoltage protecting system as shown in FIG. 1.

For example, in step S101, the controller circuit 20 fully turns off the first high-side switch H1 and the second low-side switch L2, and fully turns on the first low-side switch L1 and the second high-side switch H2 to drive the single phase motor MT to run stably. As a result, a current flows from the second high-side switch H2 through the second node OUT2 of the single phase motor MT to the first node OUT1 of the single phase motor MT, and then flows through the first low-side switch L1 to ground.

Then, when the controller circuit 20 determines that the present time reaches a commutation time point of the commutation signal HLS in step S103, the controller circuit 20 fully turns on the first high-side switch H1 and the second low-side switch L2, and fully turns off the first low-side switch L1 and the second high-side switch H2 to drive the single phase motor MT in step S105. As a result, a reverse current flows from the second node OUT2 of the single phase motor MT to the first node OUT1 of the single phase motor MT, and then flows through the first high-side switch H1 to the common voltage VCC. After step S105 is performed, step S301 is then performed.

In step S301, when the common voltage VCC is being charged by the reverse current and gradually increases, the overvoltage protecting circuit 10 detects the common voltage VCC and compares the common voltage VCC with the second reference voltage VREF2 to output the second comparison signal CP2.

For example, as shown in FIG. 8, the overvoltage protecting circuit 10 of the embodiment includes a first comparator CMP1 and a second comparator CMP2. The first input terminal such as the non-inverting input terminal of the second comparator CMP2 is coupled to the common voltage VCC. The second input terminal such as the inverting input terminal of the second comparator CMP2 is coupled to the second reference voltage VREF2. The second comparator CMP2 is configured to compare the common voltage VCC with the second reference voltage VREF2 to output the second comparison signal CP2.

In step S303, the controller circuit 20 determines whether or not the common voltage VCC is higher than the second reference voltage VREF2 and is lower than the first reference voltage VREF1, according to the second comparison signal CP2.

If the controller circuit 20 determines that the common voltage VCC is not higher than the second reference voltage VREF2, the overvoltage protecting circuit 10 continually detects and compares the common voltage VCC with the second reference voltage VREF2 in step S301.

When the controller circuit 20 determines that the common voltage VCC is charged to be higher than the second reference voltage VREF2 by the reverse current, steps S307 to S313 are then performed.

In steps S307 to S313, the controller circuit 20 slightly turns on the second high-side switch H2 that was fully turned off, but does not switch others of the switch components of the bridge driver circuit HBDV. That is, the controller circuit 20 still fully turns on the first high-side switch H1 and the second low-side switch L2, and still fully turns off the first low-side switch L1. Then, steps S107 to S123 are performed.

When the second high-side switch H2 is slightly turned on, a small amount of current slowly flows from the common voltage VCC sequentially through the second high-side switch H2 and the second low-side switch L2 to ground. As a result, the common voltage VCC is prevented from being charged to an excessive high voltage by the current, and the bridge driver circuit HBDV is prevented from being damaged by the common voltage VCC.

Fourth Embodiment

Figure 9:
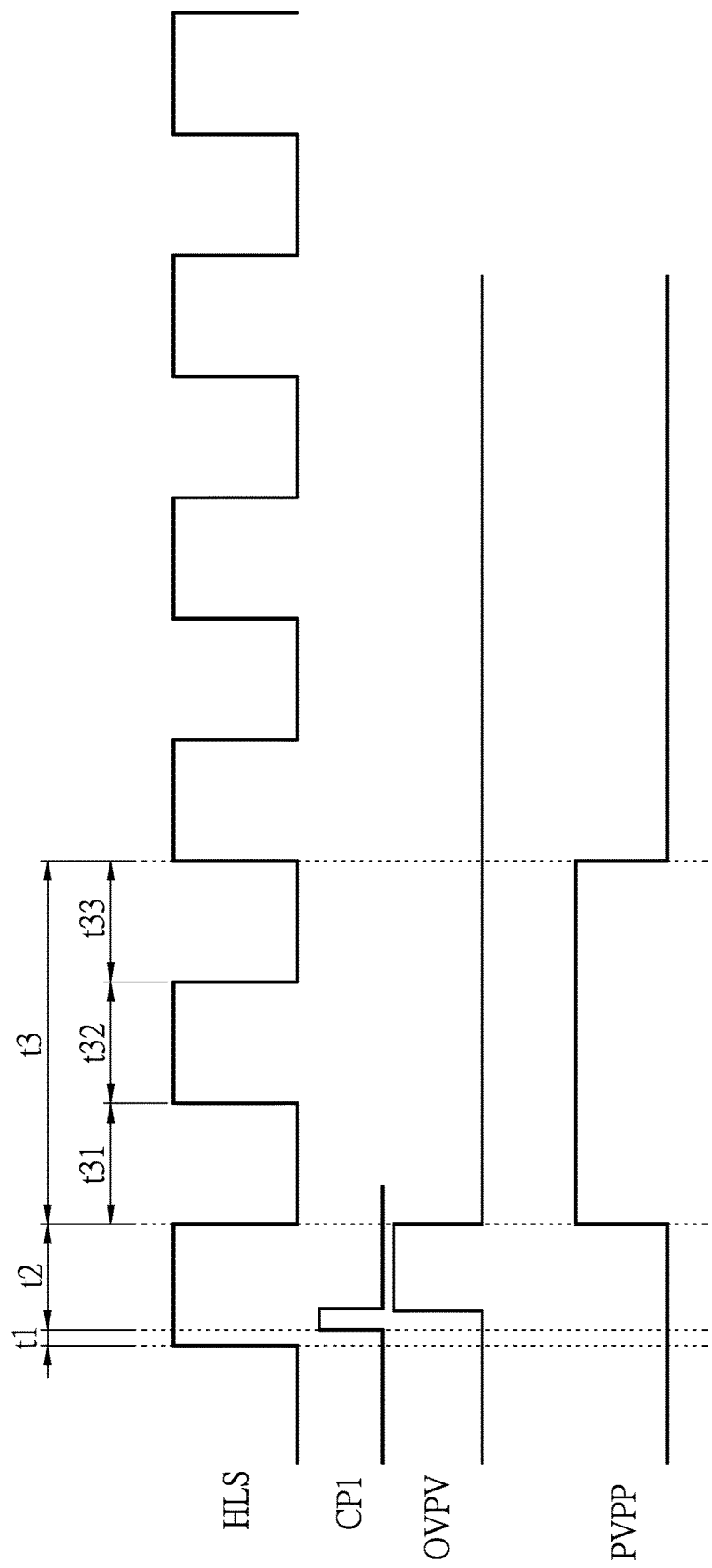
FIG. 9 is a waveform diagram of an overvoltage protecting system and method of the motor pre-driver according to a fourth embodiment of the present disclosure.

Reference is made to FIG. 9, which is a waveform diagram of an overvoltage protecting system and method of the motor pre-driver according to a fourth embodiment of the present disclosure.

When the common voltage VCC increases to be higher than the second reference voltage VREF2 and not higher than the first reference voltage VREF1, and the commutation signal HLS is at a high level (or a low level as shown in FIG. 5), the controller circuit 20 slightly turns on the first high-side switch H1 or the second high-side switch H2 that was fully turned off during a time t1, in a first stage of an overvoltage protection process. In practice, the first stage of the overvoltage protection process may be omitted according to actual requirements.

When the common voltage VCC increases to be higher than the first reference voltage VREF1 and the commutation signal HLS is at a high level (or a low level as shown in FIG. 5), the controller circuit 20 fully turns off the first high-side switch H1 and the second high-side switch H2, and fully turns on the first low-side switch L1 and the second low-side switch L2, in a second stage of the overvoltage protection process. As shown in FIG. 9, a first stage signal OVPV is at a high level during a time t2.

Then, the controller circuit 20 alternately turns on the first low-side switch L1 and the second low-side switch L2 according to the level of the commutation signal HLS in a third stage of the overvoltage protection process, as indicated by a second stage signal PVPP at a high level. For example, as shown in the dotted line AH4 and a dotted line AH6 in FIG. 5, when the commutation signal HLS is at a high level, the controller circuit 20 turns off the first low-side switch L1 and turns on the second low-side switch L2, or turns off the second low-side switch L2 and turns on the first low-side switch L1 in practice.

The controller circuit 20 alternately turns on the first low-side switch L1 and the second low-side switch L2 thrice during a time t3 shown in FIG. 9. In the embodiment, the second stage signal PVPP is at the high level during the time t3, but the present disclosure is not limited thereto. In practice, the number of times that the first low-side switch L1 and the second low-side switch L2 are alternately turns on may be increased or decreased according to actual requirements.

In summary, the present disclosure provides the overvoltage protecting system and method of the motor pre-driver, which have the following main characteristics:

1. the common voltage of the single phase motor is detected, and when the controller circuit determines that the common voltage is higher than the first reference voltage, the controller circuit fully turns off the first and second high-side switches, and fully turns on the first and second low-side switches, in the first stage, thereby preventing the common voltage from being charged by the reverse current;
2. when the present time reaches the commutation time point of the commutation signal, the motor pre-driver fully turns off the first and second high-side switches, and alternately turns on the first and second low-side switches according to the level of the commutation signal, in the second stage, such that a temperature of the bridge driver circuit is reduced; and
3. when the common voltage continually increases, the first and second high-side switches are continually turned off, thereby preventing the first and second high-side switches from being damaged due to overheating.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An overvoltage protecting system of a motor pre-driver, which is applicable to a bridge driver circuit of a single phase motor, wherein the bridge driver circuit includes a plurality of switch components, the switch components include a first high-side switch, a first low-side switch, a second high-side switch and a second low-side switch, a first terminal of the first high-side switch and a first terminal of the second high-side switch are coupled to a common voltage, a first node between a second terminal of the first high-side switch and a first terminal of the first low-side switch is connected to a first terminal of the single phase motor, a second node between a second terminal of the second high-side switch and a first terminal of the second low-side switch is connected to a second terminal of the single phase motor, and a second terminal of the first low-side switch and a second terminal of the second low-side switch are grounded, the overvoltage protecting system of the motor pre-driver comprising:

an overvoltage protecting circuit disposed in the motor pre-driver and coupled to the common voltage, and configured to compare the common voltage and a first reference voltage to output a first comparison signal; and a controller circuit disposed in the motor pre-driver, connected to a control terminal of each of the switch components and the overvoltage protecting circuit, and configured to output a plurality of controlling signals respectively to the switch components to turn on or off each of the switch components;

wherein, when the controller circuit determines that the common voltage is higher than the first reference voltage according to the first comparison signal, the controller circuit turns off the first high-side switch and the second high-side switch, and turns on the first low-side switch and the second low-side switch, during a phase time of a commutation signal;

wherein, after the phase time ends, the controller circuit alternately turns on the first low-side switch and the second low-side switch according to a level of the commutation signal.

2. The overvoltage protecting system of the motor pre-driver according to claim 1, wherein, when a present time reaches a commutation time point at which the commutation signal is traversing from a first level to a second level, the controller circuit turns off the first low-side switch and turns on the second low-side switch;

wherein, when the present time reaches a commutation time point at which the commutation signal is traversing from the second level to the first level, the controller circuit turns off the second low-side switch and turns on the first low-side switch.

3. The overvoltage protecting system of the motor pre-driver according to claim 1, wherein the overvoltage protecting circuit includes a first comparator, a first input terminal of the first comparator is coupled to the common voltage, a second input terminal of the first comparator is coupled to the first reference voltage, and the first comparator is configured to compare the common voltage with the first reference voltage to output the first comparison signal.

4. The overvoltage protecting system of the motor pre-driver according to claim 1, wherein the overvoltage protecting circuit compares the common voltage with a second reference voltage to output a second comparison signal, and when the controller circuit determines that the common voltage is higher than the second reference voltage and not higher than the first reference voltage according to the second comparison signal, the controller circuit switches the first high-side switch to an on state from an off state, still fully turns on the first low-side switch and the second high-side switch, and continually turns off the second low-side switch.

5. The overvoltage protecting system of the motor pre-driver according to claim 4, wherein the overvoltage protecting circuit further includes a second comparator, a first input terminal of the second comparator is coupled to the common voltage, a second input terminal of the second comparator is coupled to the second reference voltage, and the second comparator is configured to compare the common voltage with the second reference voltage to output the second comparison signal.

6. The overvoltage protecting system of the motor pre-driver according to claim 1, wherein the overvoltage protecting circuit compares the common voltage with a second reference voltage to output a second comparison signal, and when the controller circuit determines that the common voltage is higher than the second reference voltage and not higher than the first reference voltage according to the second comparison signal, the controller circuit switches the second high-side switch to an on state from an off state, still fully turns on the first high-side switch and the second low-side switch, and continually turns off the first low-side switch.

7. The overvoltage protecting system of the motor pre-driver according to claim 6, wherein the overvoltage protecting circuit further includes a second comparator, a first input terminal of the second comparator is coupled to the common voltage, a second input terminal of the second comparator is coupled to the second reference voltage, and the second comparator is configured to compare the common voltage with the second reference voltage to output the second comparison signal.

8. An overvoltage protecting method of a motor pre-driver, which is applicable to a bridge driver circuit of a single phase motor, wherein the bridge driver circuit includes a plurality of switch components, the switch components include a first high-side switch, a first low-side switch, a second high-side switch and a second low-side switch, a first terminal of the first high-side switch and a first terminal of the second high-side switch are coupled to a common voltage, a first node between a second terminal of the first high-side switch and a first terminal of the first low-side switch is connected to a first terminal of the single phase motor, a second node between a second terminal of the second high-side switch and a first terminal of the second low-side switch is connected to a second terminal of the single phase motor, and a second terminal of the first low-side switch and a second terminal of the second low-side switch are grounded, the overvoltage protecting method of the motor pre-driver comprising processes of:
  (a) comparing the common voltage with a first reference voltage to generate a first comparison signal;
  (b) determining whether or not the common voltage reaches the first reference voltage according to the first comparison signal, in response to determining that the common voltage does not reach the first reference voltage, returning to the process (a), in response to determining that the common voltage reaches the first reference voltage, sequentially performing the processes (c) and (d);
  (c) turning off the first high-side switch and the second high-side switch, and turning on the first low-side switch and the second low-side switch, during a phase time of a commutation signal; and
  (d) after the phase time ends, alternately turning on the first low-side switch and the second low-side switch according to a level of the commutation signal.

9. The overvoltage protecting method of the motor pre-driver according to claim 8, further comprising processes of:
  (e) determining whether or not a present time reaches a commutation time point at which the commutation signal is traversing from a first level to a second level, in response to determining that the present time reaches the commutation time point at which the commutation signal is traversing from the first level to the second level, turning off the first low-side switch and turning on the second low-side switch, but not performing the process (f), but in response to determining that the present time does not reach the commutation time point at which the commutation signal is traversing from the first level to the second level, performing the process (f); and
  (f) determining whether or not the present time reaches a commutation time point at which the commutation signal is traversing from the second level to the first level, in response to determining that the present time reaches the commutation time point at which the commutation signal is traversing from the second level to the first level, turning off the second low-side switch and turning on the first low-side switch, but in response to determining that the present time does not reach the commutation time point at which the commutation signal is traversing from the second level to the first level, returning to the process (e).

10. The overvoltage protecting method of the motor pre-driver according to claim 8, further comprising processes of:
  (g) comparing the common voltage with a second reference voltage to generate a second comparison signal; and
  (h) determining, according to the second comparison signal, whether or not the common voltage is higher than the second reference voltage and not higher than the first reference voltage, in response to determining that the common voltage is not higher than the second reference voltage or higher than the first reference voltage, returning to the process (g), but in response to determining that the common voltage is higher than the second reference voltage and not higher than the first reference voltage, switching the first high-side switch to an on state from an off state, still fully turning on the first low-side switch and the second high-side switch, and continually turns off the second low-side switch.

11. The overvoltage protecting method of the motor pre-driver according to claim 8, further comprising processes of:
  (i) comparing the common voltage with a second reference voltage to generate a second comparison signal; and
  (j) determining, according to the second comparison signal, whether or not the common voltage is higher than the second reference voltage and not higher than the first reference voltage, in response to determining that the common voltage is not higher than the second reference voltage or higher than the first reference voltage, returning to the process (i), but in response to determining that the common voltage is higher than the second reference voltage and not higher than the first reference voltage, switching the second high-side switch to an on state from an off state, still fully turning on the first high-side switch and the second low-side switch, and continually turns off the first low-side switch.

\* \* \* \* \*